(12) United States Patent
Kim et al.

(10) Patent No.: US 7,446,405 B2
(45) Date of Patent: Nov. 4, 2008

(54) WAFER LEVEL CHIP SCALE PACKAGE (WLCSP) WITH HIGH RELIABILITY AGAINST THERMAL STRESS

(75) Inventors: Jong Hoon Kim, Kyoungki-do (KR); Min Suk Suh, Seoul (KR); Chang Jun Park, Kyoungki-do (KR); Kwon Whan Han, Seoul (KR); Seong Cheol Kim, Gyeongsangnam-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 132 days.

(21) Appl. No.: 11/648,281

(22) Filed: Dec. 29, 2006

(65) Prior Publication Data

US 2007/0182022 A1    Aug. 9, 2007

(30) Foreign Application Priority Data

Feb. 8, 2006   (KR) .................... 10-2006-0012181

(51) Int. Cl.
*H01L 23/48* (2006.01)
(52) U.S. Cl. .................... 257/690; 257/773; 257/780; 257/781; 257/778; 257/E23.023; 257/E23.069
(58) Field of Classification Search ............... 257/690, 257/693, 700, 734–737, 773, 776, 780, 781, 257/778–786, E23.023, E23.069
See application file for complete search history.

(56) References Cited

U.S. PATENT DOCUMENTS

| 6,465,878 | B2 | 10/2002 | Fjelstad et al. |
| 6,492,200 | B1 | 12/2002 | Park et al. |
| 6,696,644 | B1* | 2/2004 | Chiu et al. .................. 174/535 |
| 6,847,101 | B2 | 1/2005 | Fjelstad et al. |
| 2003/0153099 | A1* | 8/2003 | Jiang et al. ..................... 438/1 |

FOREIGN PATENT DOCUMENTS

| JP | 10-050884 | 2/1998 |
| JP | 11-087554 | 3/1999 |
| JP | 2000-036549 | 2/2000 |
| JP | 2005-286087 | 10/2005 |
| KR | 1998-21939 A | 6/1998 |
| KR | 1020000001598 | 1/2000 |

OTHER PUBLICATIONS

Deok-Hoon Kim et al; "Solder joint reliability of a polymer reinforced wafer level package" Microelectronics Reliability 42 (2002) pp. 1837-1848.

Jinwon Joo et al; "Characterization of flexural and thermo-mechanical behavior of plastic ball grid package assembly using moiré interforometry" Microelectronics Reliability 45 (2005) pp. 637-646.

* cited by examiner

*Primary Examiner*—Jasmine J Clark
(74) *Attorney, Agent, or Firm*—Ladas & Parry LLP

(57) ABSTRACT

A wafer level chip scale package includes a semiconductor chip having a plurality of pads; a lower insulation layer having a high Young's modulus of 1~5 GPa formed on the semiconductor chip to expose the plurality of pads; a plurality of metal patterns formed on the lower insulation layer to be connected to the respective pads; an upper insulation layer having a high Young's modulus of 1~5 GPa formed on the lower insulation layer and the metal patterns to partially expose the metal patterns; and a plurality of solder balls formed on exposed portions of the metal patterns.

5 Claims, 4 Drawing Sheets

WAFER LEVEL CHIP SCALE PACKAGE (WLCSP) WITH HIGH RELIABILITY AGAINST THERMAL STRESS

CROSS-REFERENCE TO RELATED APPLICATIONS

The present application claims priority to Korean patent application number 10-2006-0012181 filed on Feb. 8, 2006, which is incorporated by reference in its entirety.

BACKGROUND OF THE INVENTION

The present invention relates to a semiconductor chip package, and more particularly to a wafer level chip scale package which has improved reliability against thermal stress.

In order to ensure miniaturization and multi-functionality of electronic products or communication devices, semiconductor packages are required to be of small in size, light weight, multi-pin connection, high speed, and high functionality. In order to meet these requirements, packages are to be of substantially a chip size at a wafer level when manufactured. This type of packages is known as a wafer level chip scale package (WLCSP).

FIG. 1 is a cross-sectional view illustrating a conventional WLCSP. The WLCSP 100 includes: a semiconductor chip 110 having a plurality of edge pads 120; a lower insulation layer 130 formed on the semiconductor chip 110 to expose the edge pads 120 and having a low Young's modulus; metal patterns 140 formed on the lower insulation layer 130 connected to the edge pads 120; an upper insulation layer 150 formed on the lower insulation layer 130 including the metal patterns 140 to partially expose the metal patterns 140 and having either a low or high Young's modulus; and solder balls 160 bonded to the exposed portions of the metal patterns 140. The solder balls 160 are positioned along the center portion of the WLCSP 100. Young's modulus is a term in solid mechanics for quantifying stiffness of a material measured in pascal or gigapascal (as in the SI convention) or in the unit of pressure such as pounds per square inch.

As shown in FIGS. 2A-2D, the WLCSP 100 is mounted on a printed circuit board 200 by the solder balls 160.

In a conventional WLCSP 100, problematic cracks A (see FIG. 2D) appear in the metal patterns 140 when the WLCSP 100 undergoes a thermal cycling test for measuring the characteristic lifetime with respect to temperature changes due to different thermal expansion coefficients of the semiconductor chip 110 and the printed circuit board 200.

Referring to FIG. 2A, as the temperature rises during a thermal cycling test, the printed circuit board 200 bonded to the solder balls 160 of the semiconductor chip 110 is bent toward the semiconductor chip 110. This occurs since the printed circuit board 200 has a higher thermal expansion coefficient than the semiconductor chip 110.

Referring to FIG. 2B, as the high temperature is maintained for a period of time, the printed circuit board 200 bent in the way shown in FIG. 2A returns to its original shape due to "creep" of the solder balls 160. Creep refers to plastic deformation of a material where, for example, the creep in solids occurs at high temperatures where atoms are mobile.

When the temperature falls therafter, as shown in FIG. 2C, the printed circuit board 200 bends away from the semiconductor chip 110. Then, the force applied to the solder balls 160 introduces tensile stresses in the metal patterns 140 connected to the solder balls 160, and as shown in FIG. 2D, the cracks A occur in the metal patterns 140.

The cracks A are formed, because the lower insulation layer 130 having a low Young's modulus and the upper insulation layer 150 having a low or high Young's modulus do not sufficiently reduce the tensile stresses applied to the metal patterns 140 by the solder balls 160. The cracks A in the metal patterns 140 leads to product defects.

SUMMARY OF THE INVENTION

The present invention is directed to a WLCSP which can suppress the occurrence of cracks in metal patterns due to a change in temperature.

Also, the present invention is directed to a WLCSP which can suppress the occurrence of cracks in metal patterns due to a change in temperature, thereby improving reliability.

In one embodiment, a wafer level chip scale package comprises a semiconductor chip having a plurality of pads; a lower insulation layer formed on the semiconductor chip to expose the plurality of pads, and having a high Young's modulus of 1~5 GPa; a plurality of metal patterns formed on the lower insulation layer to be connected with the respective pads; an upper insulation layer formed on the lower insulation layer and the metal patterns to partially expose the metal patterns, and having a high Young's modulus of 1~5 GPa; and a plurality of solder balls formed on exposed portions of the metal patterns.

The lower and upper insulation layers are formed of one selected from the group consisting of an epoxy-based material, a rubber-based material, a silicon-based material, polyimide-based material, and a benzocyclobutene-based material.

The plurality of pads are positioned adjacent to both edges of the semiconductor chip, and the plurality of solder balls are positioned on a center portion of the semiconductor chip.

The plurality of pads are positioned adjacent to four edges of the semiconductor chip, and the plurality of solder balls are positioned on a center portion of the semiconductor chip.

The plurality of pads and the plurality of solder balls are positioned on a center portion of the semiconductor chip, and one part of the plurality of metal patterns is detoured through peripheries of the semiconductor chip and connects one part of the plurality of pads and one part of the plurality of solder balls with each other, to be prevented from being shorted with one another.

DESCRIPTION OF SPECIFIC EMBODIMENTS

The present invention is directed to, inter alia, a lower insulation layer having a high Young's modulus of 1~5 Gpa and formed on a semiconductor chip, and metal patterns are formed on the lower insulation layer having the high Young's modulus.

Then, the lower insulation layer having a high Young's modulus will exhibit a low strain when undergoing a thermal cycling test. Thus, the lower insulation layer having a high Young's modulus performs the function of decreasing the stress applied to the metal patterns. The present invention, therefore, makes it possible to suppress and prevent cracks from occurring in the metal patterns, helping to eliminate product defects.

Figure 1:
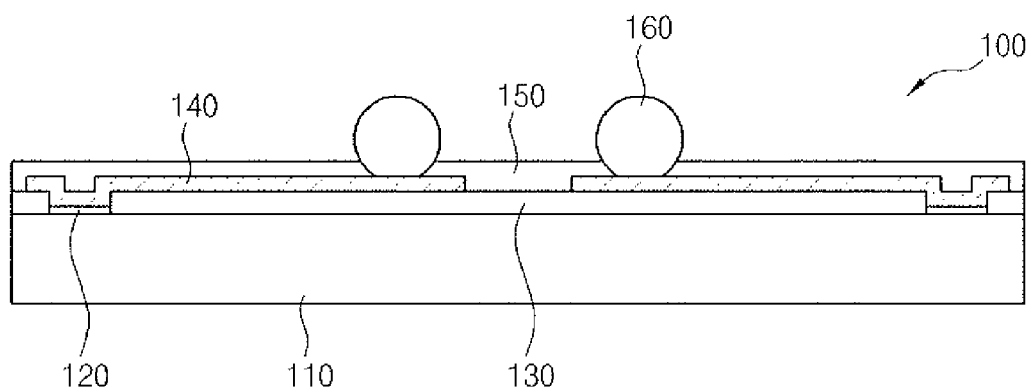
FIG. 1 is a cross-sectional view illustrating a conventional wafer level chip scale package.
Figure 2A:
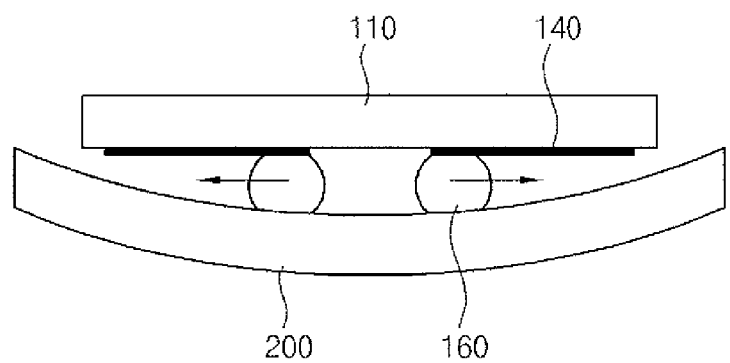
FIGS. 2A through 2D are cross-sectional views sequentially illustrating a procedure in which cracks are formed in a metal pattern when conducting a thermal cycling test for the wafer level chip scale package shown in FIG. 1.
Figure 2B:
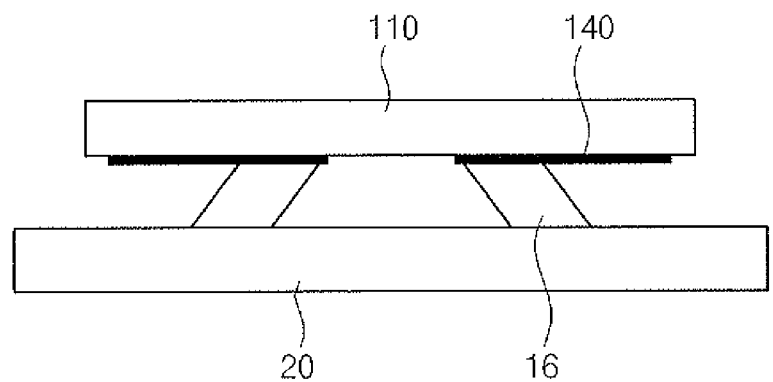
Figure 2C:
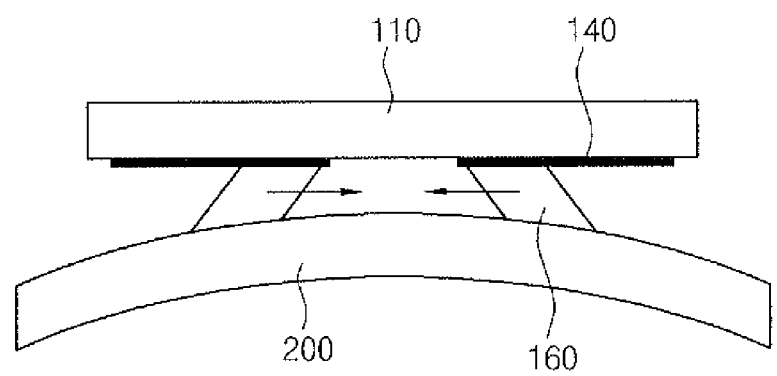
Figure 2D:
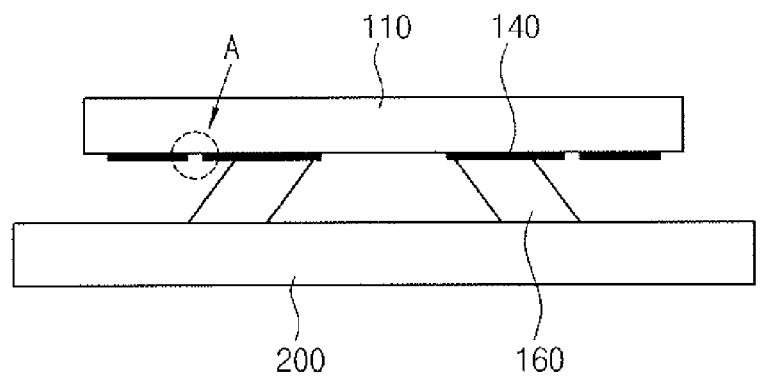
Figure 3:
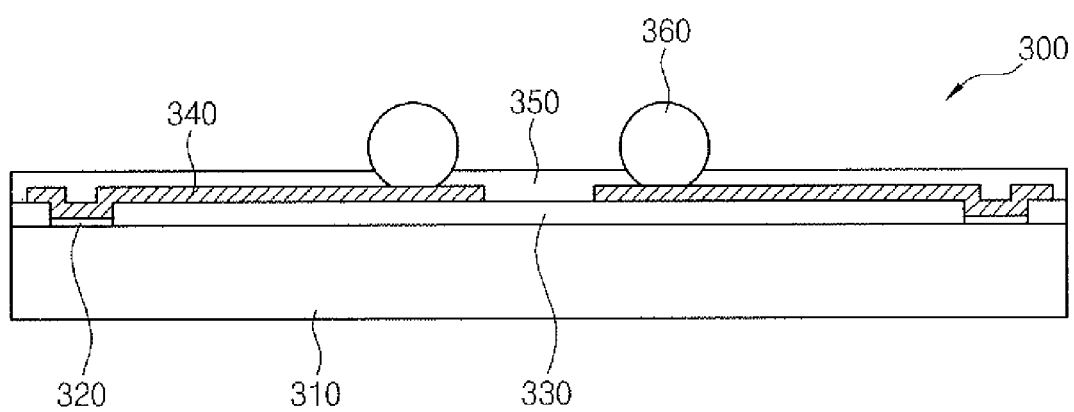
FIG. 3 is a cross-sectional view illustrating a wafer level chip scale package in accordance with a first embodiment of the present invention.

FIG. 3 is a cross-sectional view illustrating a WLCSP in accordance with a first embodiment of the present invention. The WLCSP 300 includes a semiconductor chip 310 which has a plurality of edge pads 320. A lower insulation layer 330 is formed on the semiconductor chip 310 while exposing the edge pads 320. A plurality of metal patterns 340 are formed on the lower insulation layer 330. Each of the metal patterns 340 is electrically connected to the respective one of the edge pads 320. An upper insulation layer 350 is formed on the lower insulation layer 330 and the metal patterns 340. The portions of the metal patterns 340 are exposed through the upper insulation layer 350 to form a plurality of solder balls 360. The solder balls 360 are bonded to the exposed portions of the metal patterns 340 and serve as the mounting members for mounting the WLCSP 300 to a printed circuit board (not shown).

The solder balls 360 are positioned along the center portion of the semiconductor chip 310. The lower and upper insulation layers 330, 350 are formed of a material having a high Young's modulus (a high modulus of elasticity) preferably but not limited to 1-5 Gpa. The materials having a high Young's modulus include: an epoxy-based material, a rubber-based material, a silicon-based material, polyimide-based material, a benzocyclobutene-based material, and similar others. The edge pads 320 may be formed along the two or four (or other number of) edges of the semiconductor chip 310 as a matter of design choice.

Because the lower and upper insulation layers 330, 350 are formed of a material having a high Young's modulus, it suppresses or prevents cracks being formed in the metal patterns 340 due to different thermal expansion coefficients between the semiconductor chip 310 and the printed circuit board while undergoing a thermal cycling test with changing temperature conditions to measure a characteristic lifetime of the WLCSP 300.

That is, when conducting a thermal cycling test while repeatedly raising and lowering the temperature of the WLCSP 300 mounted to the printed circuit board to predetermined temperatures, a tensile stress is applied to the metal patterns 340 in conformity with the direction of force acting on the solder balls 360 due to the difference in thermal expansion coefficient between the semiconductor chip 310 and the printed circuit board. In this regard, in the WLCSP 300 according to an embodiment of the present invention, the lower and upper insulation layers 330, 350, which are formed under and over the metal patterns 340 and have a high Young's modulus, reinforce the metal patterns 340, thereby suppressing or preventing the occurrence of cracks in the metal patterns 340.

The upper insulation layer 350 performs not only the function of reinforcing the metal patterns 340 as described above, but also performs the function of protecting the metal patterns 340 from external shocks.

As a result, because the insulation layers 330, 350 each having a high Young's modulus are formed under and over the metal patterns 340, the reliability of the WLCSP 300 is improved.

Figure 4:
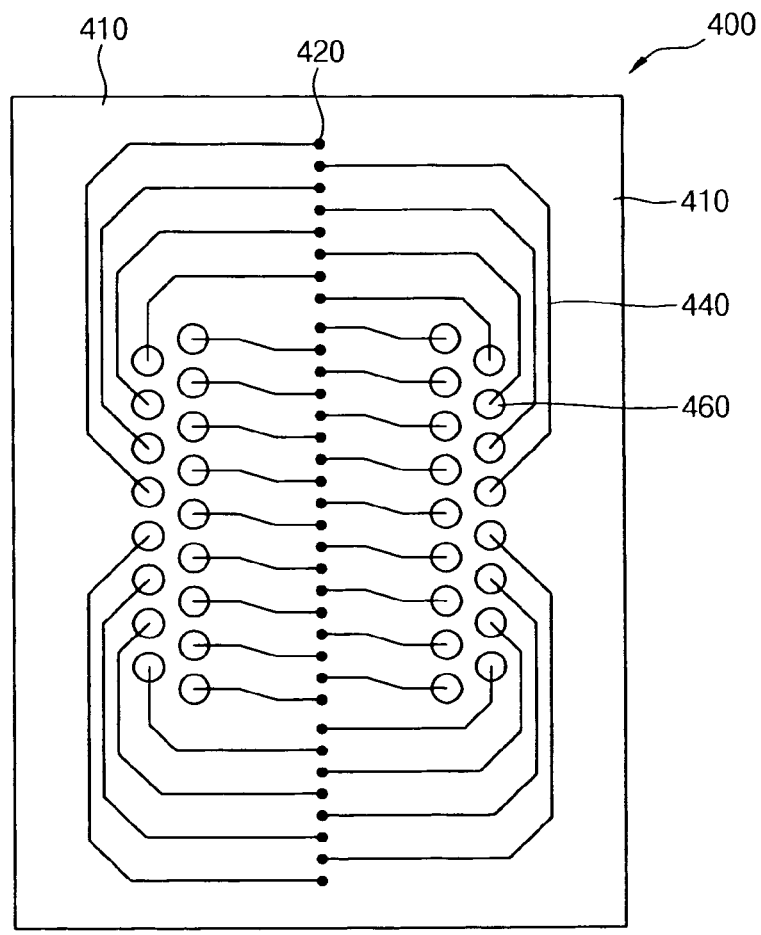
FIG. 4 is a plan view illustrating a wafer level chip scale package in accordance with a second embodiment of the present invention.
Figure 5:
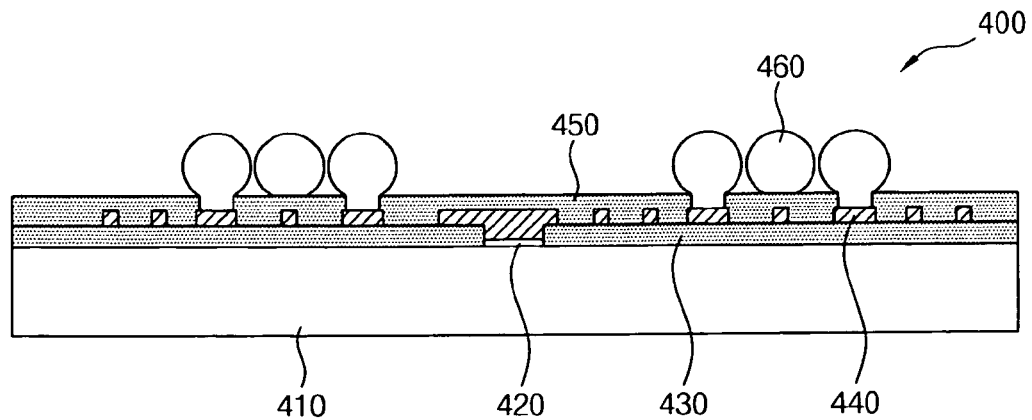
FIG. 5 is a cross-sectional view illustrating the semiconductor chip package of FIG. 4.

FIG. 4 is a plan view and FIG. 5 is a cross-sectional view for illustrating a WLSCP 400 in accordance with a second embodiment of the present invention. According to this embodiment, a lower insulation layer 430 having a high Young's modulus is formed on a semiconductor chip 410 having a plurality of center pads 420 such that the center pads 420 are exposed. A plurality of metal patterns 440 are formed on the lower insulation layer 430 to be connected to the respective center pads 420. An upper insulation layer 450 having a high Young's modulus is formed on the lower insulation layer 430 to partially expose the metal patterns 440. The lower and upper insulation layers 430, 450 which are formed under and over the metal patterns 440 are made of a material having a high Young's modulus of preferably but not limited to 1~5 Gpa. The materials having a high Young's modulus include: an epoxy-based material, a rubber-based material, a silicon-based material, polyimide-based material, a benzocyclobutene-based material, and other like materials. The solder balls 460 are bonded to the exposed portions of the metal patterns 440 and serve as the mounting members for mounting the WLCSP 400 to a printed circuit board (not shown).

The solder balls 460 are positioned on the center portion and/or other areas of the semiconductor chip 410 predetermined by design. For example, the solder balls 460 in FIG. 4 are positioned on both sides of the center pads 420 (or separated from the center pads 420 by a predetermined distance) so that the rows of the solder balls 460 are collectively positioned on the center portion of the semiconductor chip 410.

Since the plurality of metal patterns 440 must be patterned to avoid metal pattern shorts, a subset of metal patterns 440 are patterned as straightforward connections to the inner two rows of the solder balls 460, and the other metal patterns 440 are patterned as non-straightforward connections to the outer two rows of the solder balls 460 by going around all rows of the metal patterns 440, that is, being detoured through the peripheries of the semiconductor chip 410 by being bent three or four times.

In this structure, it was found that the lifetime of parts are extended when compared to a conventional WLCSP in which solder balls are positioned adjacent to the edges of a semiconductor chip. In other words, in the present invention, when conducting a thermal cycling test, the time when cracks occur in solder balls is delayed when compared to the conventional structure, by which the lifetime of each part is extended. Nevertheless, when conducting a thermal cycling test, before cracks occur in the solder balls, cracks occur in advance in the metal patterns due to a tensile stress applied to the metal patterns which are detoured through the peripheries of the semiconductor chip. In this regard, in the conventional art, since lower and upper insulation layers having a low Young's modulus do not sufficiently disperse the tensile stress, cracks occur in the metal patterns.

In the present invention, in order to disperse a tensile stress applied to the metal patterns, the lower and upper insulation layers are formed under and over the metal patterns using a material having a high Young's modulus. Therefore, as the tensile stress applied to the metal patterns is absorbed, cracks do not occur in the metal patterns.

Accordingly, the WLSCP according to this second embodiment of the present invention allows a characteristic lifetime to be extended without experiencing the occurrence of cracks in the metal patterns when compared to the conventional art.

As is apparent from the above description, the semiconductor chip package according to the present invention provides advantages in that, since lower and upper insulation layers having a high Young's modulus are formed under and over metal patterns to reinforce the strength of the metal patterns, it is possible to suppress or prevent the occurrence of cracks in the metal patterns when the package undergoes a thermal cycling test.

In the drawings and specification, there have been disclosed specific embodiments of the invention and, although specific terms are employed, they are used in a generic and descriptive sense only and not for purposes of limitation, the scope of the invention being set forth in the following claims.

What is claimed is:

1. A wafer level chip scale package comprising:
    a semiconductor chip having a plurality of pads;
    a lower insulation layer having a high Young's modulus in the range of 1-5 GPa formed on the semiconductor chip to expose the plurality of pads;
    a plurality of metal patterns formed on the lower insulation layer, each metal pattern connected to one of the pads;
    a upper insulation layer having a high Young's modulus in the range of 1-5 GPa formed on the lower insulation layer and the metal patterns to partially expose the metal patterns; and
    a plurality of solder balls formed on the exposed portions of the metal patterns.

2. The wafer level chip scale package as set forth in claim 1, wherein the lower and upper insulation layers include an epoxy-based material or a rubber-based material or a silicon-based material or polyimide-based material or a benzocyclobutene-based material.

3. The wafer level chip scale package as set forth in claim 1, wherein the plurality of pads are positioned near the edges of the semiconductor chip, and the plurality of solder balls are positioned closer to the center portion of the semiconductor chip.

4. The wafer level chip scale package as set forth in claim 3, wherein the plurality of pads are positioned near the two or four edges of the semiconductor chip, and the plurality of solder balls are positioned closer to the center portion of the semiconductor chip.

5. The wafer level chip scale package as set forth in claim 1,
    wherein the plurality of pads are positioned on or near the center portion of the semiconductor chip,
    wherein a first subset of the solder balls and a second subset of the solder balls are positioned on the semiconductor chip such that the each solder ball of the first subset is located closer to the nearest one of the pads than the solder ball of the second subset that is located nearest the solder ball of the first subset,
    wherein each solder ball of the first subset is connected to one of the pads by one of the metal patterns formed to extend in a direction substantially free of sharp bending, and
    wherein each solder ball of the second subset is connected to one of the pads by one of the metal patterns formed in a substantially curved line.

* * * * *